US006893916B2

(12) United States Patent
Baukus et al.

(10) Patent No.: US 6,893,916 B2
(45) Date of Patent: May 17, 2005

(54) PROGRAMMABLE CONNECTOR/ISOLATOR AND DOUBLE POLYSILICON LAYER CMOS PROCESS WITH BURIED CONTACT USING THE SAME

(75) Inventors: James P. Baukus, Westlake Village, CA (US); Lap-Wai Chow, South Pasadena, CA (US); William M. Clark, Jr., Camarillo, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/619,981

(22) Filed: Jul. 14, 2003

(65) Prior Publication Data

US 2004/0012067 A1 Jan. 22, 2004

Related U.S. Application Data

(62) Division of application No. 09/882,900, filed on Jun. 15, 2001.

(51) Int. Cl.⁷ .................. H01L 21/8242; H01L 21/336; H01L 21/00
(52) U.S. Cl. .................. 438/253; 438/280; 438/96
(58) Field of Search .................. 438/199, 253, 438/96, 280, 526

(56) References Cited

U.S. PATENT DOCUMENTS

| 3,673,471 A | 6/1972 | Klein et al. ............... 257/407 |
| 3,946,426 A | 3/1976 | Sanders .................... 357/71 |
| 4,017,888 A | 4/1977 | Christie et al. ............ 357/54 |

(Continued)

FOREIGN PATENT DOCUMENTS

| EP | 0 186 855 A2 | 7/1986 |
| EP | 0 364 769 | 4/1990 |
| EP | 0 463 373 | 1/1992 |
| EP | 0 528 302 A1 | 2/1993 |
| EP | 0 585 601 A1 | 3/1994 |
| EP | 0 764 985 A2 | 3/1997 |
| EP | 0 883 184 A2 | 12/1998 |
| EP | 0 920 057 A2 | 6/1999 |
| EP | 1 193 758 A1 | 4/2002 |
| EP | 1 202 353 A1 | 5/2002 |
| FR | 2486717 | 1/1982 |
| JP | 58-190064 | 11/1983 |
| JP | 61-147551 | 7/1986 |
| JP | 63 129647 A | 6/1988 |
| JP | 02-046762 | 2/1990 |
| JP | 02-237038 | 9/1990 |
| JP | 10-256398 | 9/1998 |
| WO | 98/21734 | 5/1998 |
| WO | 98/57373 | 12/1998 |
| WO | 00/44012 | 7/200 |

OTHER PUBLICATIONS

Blythe, et al., "Layout Reconstruction of Complex Silicon Chips," *IEEE Journal of Solid–State Circuits*, pp. 138–145 (Feb. 1993).

(Continued)

*Primary Examiner*—John F. Niebling
*Assistant Examiner*—Walter L Lindsay, Jr.
(74) *Attorney, Agent, or Firm*—Ladas & Parry LLC (57) ABSTRACT

An integrated circuit structure for MOS-type devices including a silicon substrate of a first conductivity type; a first gate insulating regions selectively placed over the silicon substrate of the first conductivity tape; a first polycrystalline silicon layer selectively placed over the silicon substrate of the first conductivity type; a second gate insulating regions selectively placed over the first gate insulating regions and the first polycrystalline silicon layer; a second polycrystalline silicon layer selectively placed over the second gate insulating regions; first buried silicon regions of a second conductivity type, buried within the silicon substrate of the first conductivity type, placed under the first polycrystalline silicon layer and in contact therewith; and second buried silicon regions of the second conductivity type, buried within the silicon substrate of the first conductivity type, placed under the second gate insulating regions, under the second polycrystalline silicon layer and insulated therefrom.

6 Claims, 5 Drawing Sheets

U.S. PATENT DOCUMENTS

| | | | |
|---|---|---|---|
| 4,101,344 A | 7/1978 | Kooi et al. | 148/1.5 |
| 4,139,864 A | 2/1979 | Schulman | 358/188 |
| 4,164,461 A | 8/1979 | Schilling | 204/192 EC |
| 4,196,443 A | 4/1980 | Dingwall | 257/774 |
| 4,267,578 A | 5/1981 | Vetter | 364/709 |
| 4,291,391 A | 9/1981 | Chatterjee et al. | 365/184 |
| 4,295,897 A | 10/1981 | Tubbs et al. | 148/1.5 |
| 4,314,268 A | 2/1982 | Yoshioka et al. | 357/48 |
| 4,317,273 A | 3/1982 | Guterman et al. | 29/571 |
| 4,322,736 A | 3/1982 | Sasaki et al. | 257/369 |
| 4,374,454 A | 2/1983 | Jochems | 29/571 |
| 4,409,434 A | 10/1983 | Basset et al. | 380/265 |
| 4,435,895 A | 3/1984 | Parrillo | 29/571 |
| 4,471,376 A | 9/1984 | Morcom et al. | 357/71 |
| 4,581,628 A | 4/1986 | Miyauchi et al. | 357/71 |
| 4,583,011 A | 4/1986 | Pechar | 307/440 |
| 4,603,381 A | 7/1986 | Guttag et al. | 364/200 |
| 4,623,255 A | 11/1986 | Suszko | 356/389 |
| 4,727,493 A | 2/1988 | Taylor, Sr. | 364/490 |
| 4,766,516 A | 8/1988 | Ozdemir et al. | 361/380 |
| 4,799,096 A | 1/1989 | Koeppe | 357/42 |
| 4,821,085 A | 4/1989 | Haken et al. | 357/67 |
| 4,830,974 A | 5/1989 | Chang et al. | 437/34 |
| 4,939,567 A | 7/1990 | Kenney | 257/383 |
| 4,962,484 A | 10/1990 | Takeshima et al. | 365/226 |
| 4,975,756 A | 12/1990 | Haken et al. | 357/4.1 |
| 4,998,151 A | 3/1991 | Korman et al. | 257/328 |
| 5,030,796 A | 7/1991 | Swanson et al. | 174/52.2 |
| 5,050,123 A | 9/1991 | Castro | 365/53 |
| 5,061,978 A | 10/1991 | Mizutani et al. | 357/30 |
| 5,065,208 A | 11/1991 | Shah et al. | 357/34 |
| 5,068,697 A | 11/1991 | Noda et al. | 357/23.5 |
| 5,070,378 A * | 12/1991 | Yamagata | 257/315 |
| 5,101,121 A | 3/1992 | Sourgen | 307/465 |
| 5,117,276 A | 5/1992 | Thomas et al. | 357/71 |
| 5,121,089 A | 6/1992 | Larson et al. | 333/107 |
| 5,121,186 A | 6/1992 | Wong et al. | 257/384 |
| 5,132,571 A | 7/1992 | McCollum et al. | 307/465.1 |
| 5,138,197 A | 8/1992 | Kuwana | 307/449 |
| 5,146,117 A | 9/1992 | Larson | 307/465 |
| 5,168,340 A | 12/1992 | Nishimura | 357/376 |
| 5,177,589 A | 1/1993 | Kobayashi et al. | 257/773 |
| 5,202,591 A | 4/1993 | Walden | 307/450 |
| 5,225,699 A | 7/1993 | Nakamura | 257/306 |
| 5,227,649 A | 7/1993 | Chapman | 257/204 |
| 5,231,299 A | 7/1993 | Ning et al. | 257/316 |
| 5,302,539 A | 4/1994 | Haken et al. | 437/41 |
| 5,308,682 A | 5/1994 | Morikawa | 428/195 |
| 5,309,015 A | 5/1994 | Kuwata et al. | 257/659 |
| 5,317,197 A * | 5/1994 | Roberts | 257/401 |
| 5,336,624 A | 8/1994 | Walden | 437/34 |
| 5,341,013 A | 8/1994 | Koyanagi et al. | 257/368 |
| 5,345,105 A | 9/1994 | Sun et al. | 257/659 |
| 5,354,704 A * | 10/1994 | Yang et al. | 438/280 |
| 5,369,299 A | 11/1994 | Byrne et al. | 257/638 |
| 5,371,390 A | 12/1994 | Mohsen | 257/209 |
| 5,376,577 A * | 12/1994 | Roberts et al. | 438/526 |
| 5,384,472 A | 1/1995 | Yin | 257/204 |
| 5,384,475 A | 1/1995 | Yahata | 257/314 |
| 5,399,441 A | 3/1995 | Bearinger et al. | 428/689 |
| 5,404,040 A * | 4/1995 | Hshieh et al. | 438/268 |
| 5,412,237 A * | 5/1995 | Komori et al. | 257/306 |
| 5,441,902 A | 8/1995 | Hsieh et al. | 437/34 |
| 5,468,990 A | 11/1995 | Daum | 257/632 |
| 5,475,251 A | 12/1995 | Kuo et al. | 257/316 |
| 5,506,806 A | 4/1996 | Fukushima | 365/195 |
| 5,531,018 A | 7/1996 | Saia et al. | 29/622 |
| 5,539,224 A | 7/1996 | Ema | 257/211 |
| 5,541,614 A | 7/1996 | Lam et al. | 343/792.5 |
| 5,571,735 A | 11/1996 | Mogami et al. | 437/41 |
| 5,576,988 A | 11/1996 | Kuo et al. | 365/185.04 |
| 5,611,940 A | 3/1997 | Zettler | 73/514.16 |
| 5,638,946 A | 6/1997 | Zavracky | 200/181 |
| 5,656,836 A * | 8/1997 | Ikeda et al. | 257/305 |
| 5,677,557 A | 10/1997 | Wuu et al. | 257/382 |
| 5,679,595 A | 10/1997 | Chen et al. | 437/52 |
| 5,700,704 A * | 12/1997 | Ikeda et al. | 438/253 |
| 5,719,422 A | 2/1998 | Burr et al. | 257/336 |
| 5,719,430 A | 2/1998 | Goto | 257/403 |
| 5,721,150 A | 2/1998 | Pasch | 437/46 |
| 5,783,846 A | 7/1998 | Baukus et al. | 257/204 |
| 5,821,590 A | 10/1998 | Lee et al. | 257/377 |
| 5,834,851 A * | 11/1998 | Ikeda et al. | 257/69 |
| 5,838,047 A | 11/1998 | Yamauchi et al. | 257/372 |
| 5,854,510 A | 12/1998 | Sur, Jr. et al. | 257/529 |
| 5,866,933 A | 2/1999 | Baukus et al. | 257/368 |
| 5,880,503 A | 3/1999 | Matsumoto et al. | 257/372 |
| 5,888,887 A | 3/1999 | Li et al. | 438/525 |
| 5,895,241 A | 4/1999 | Lu et al. | 438/275 |
| 5,920,097 A | 7/1999 | Horne | 257/368 |
| 5,930,663 A | 7/1999 | Baukus et al. | 438/598 |
| 5,930,667 A | 7/1999 | Oda | 438/622 |
| 5,973,375 A | 10/1999 | Baukus et al. | 257/399 |
| 5,977,593 A | 11/1999 | Hara | 257/356 |
| 5,998,257 A | 12/1999 | Lane et al. | 438/253 |
| 6,037,627 A | 3/2000 | Kitamura et al. | 257/324 |
| 6,046,659 A | 4/2000 | Loo et al. | 333/262 |
| 6,054,659 A | 4/2000 | Lee et al. | 200/181 |
| 6,057,520 A | 5/2000 | Goodwin-Johansson | 200/181 |
| 6,080,614 A | 6/2000 | Neilson et al. | 438/238 |
| 6,093,609 A | 7/2000 | Chuang | 438/286 |
| 6,117,762 A | 9/2000 | Baukus et al. | 438/618 |
| 6,118,152 A * | 9/2000 | Yamaguchi et al. | 257/347 |
| 6,137,318 A | 10/2000 | Takaaki | 326/112 |
| 6,154,388 A | 11/2000 | Oh | 365/185.04 |
| 6,166,419 A * | 12/2000 | Araki | 257/500 |
| 6,215,158 B1 | 4/2001 | Choi | 257/368 |
| 6,255,155 B1 | 7/2001 | Lee et al. | 438/222 |
| 6,294,816 B1 | 9/2001 | Baukus et al. | 257/368 |
| 6,326,675 B1 | 12/2001 | Scott et al. | 257/608 |
| 6,365,453 B1 | 4/2002 | Deboer et al. | 438/253 |
| 6,503,787 B1 | 1/2003 | Choi | 438/214 |
| 6,570,222 B2 * | 5/2003 | Nozaki et al. | 257/347 |
| 6,740,942 B2 * | 5/2004 | Baukus et al. | 257/406 |

OTHER PUBLICATIONS

Document No. 02237038, dated Dec. 9, 1990, Patent Abstracts of Japan, vol. 014, No. 550 (E–1009).

Document No. 63129647, dated Jun. 2, 1988, Patent Abstracts of Japan, vol. 012, No. 385 (E–668), Oct. 14, 1998.

Frederiksen, Thomas M., "Standard Circuits in the New CMOS Era," *Intuitive CMOS Electronics*, Revised Edition, pp. 134–146 (1989).

Hodges and Jackson, *Analysis and Design of Digital Integrated Circuits*, 2nd edition, McGraw–Hill, p. 353 (1988).

IBM_TDB, "Double Polysilicon Dynamic Memory Cell with Polysilicon Bit line," pp. 3828–3831 (Feb. 1979).

IBM_TDB, "Static Ram Double Polysilicon Process," pp. 3683–3686 (Jan. 1981).

Ng, K.K., *Complete Guide to Semiconductor Devices*, McGraw–Hill, Inc., pp 164–165 (1995).

Patent Abstracts of Japan, vol. 016, No. 197 (p–1350) May 12, 1992 & JP–A–40 28 092 (Toshiba Corp), abstract.

Larson, L.E., et al., "Microactuators for GaAs–based Microwave Integrated Circuits," *IEEE*, pp. 743–746 (1991).

Lee, "Engineering a Device for Electron–beam Probing," *IEEE Design and Test of Computers*, pp. 36–49 (1989).

Sze, S.M., *VLSI Technology*, McGraw–Hill, pp. 99, 447, 461–465 (1983).

Sze, S.M., ed., "Silicides for Gates and Interconnections," *VLSI Technology*, McGraw–Hill, pp. 372–380 (1983).

* cited by examiner

PROGRAMMABLE CONNECTOR/ISOLATOR AND DOUBLE POLYSILICON LAYER CMOS PROCESS WITH BURIED CONTACT USING THE SAME

This application is a division on Ser. No. 09/882,900 filed Jun. 15, 2001.

BACKGROUND OF THE INVENTION

1. Field of the Invention

The present invention relates to the prevention of reverse engineering of integrated circuits, and more particularly to an integrated circuit structure comprising a programmable connector/isolator between polysilicon (i.e. polycrystalline silicon) and source/drain N+ or P+ regions, to be used in a MOS-type circuit, like nMOS, pMOS or CMOS.

2. Description of the Related Art

The design, development and manufacturing efforts pertaining to semiconductor integrated circuits involve the understanding of complex structures, processes and manufacturing techniques involving smaller and smaller electronic circuitry. Efforts to be able to achieve such understanding and establish successful design, development and production manufacturing of such integrated circuits involve many man-hours of highly skilled professionals and considerable expense.

On the other hand, to avoid costly man-hours and other significant expenses some developers resort to reverse engineering practices wherein existing devices are taken apart, probed and otherwise examined to determine the physical structures of the resultant integrated circuit under review for subsequent copying. This reverse engineering, which typically relies primarily on obtaining planar optical image of the circuit, in essence attempts to by-pass typical product development efforts and expenses by studying and copying a competitive product.

Various approaches have been developed in an attempt to thwart such reverse engineering efforts, particularly in the field of semiconductor integrated circuits.

For example, U.S. Pat. No. 5,866,933 in the name of the same inventors of the present application teaches how transistors in a CMOS circuit can be connected by hidden lines between the transistors, via modifying the P+ and N+ source/drain masks. These implanted interconnections are further used to make a 3-input AND and OR circuit look substantially the same.

Moreover, U.S. Pat. No. 5,783,846 in the name of the same inventors of the present application teaches a further modification in the source/drain implant masks so that the implanted connecting lines between transistors have a gap inserted, the length of which is approximately the length of the feature size of the CMOS technology being used. If the gap is "filled" with one kind of implant (depending on the implanted connecting line being p or n) the line conducts. But, if the gap is filled with the other kind of implant the line does not conduct. These gaps are called "channel blocks". Thereby the reverse engineer must determine connectivity on the basis of resolving the n or p implant at the minimum feature size of the channel block. Moreover, transistor sizes and metal connection routings are modified, to eliminate keys by which the reverse engineer can find inputs, outputs, gate lines etc. as keys to the circuit functionality.

Hence, the reverse engineer is forced to examine every transistor within the IC to determine functionality and connectivity, so that he is prevented from making effective progress. In this way, the task for the reverse engineer to discover the entire functionality of an IC containing many tens of thousands transistors is clearly impractical.

However, the modern reverse engineer has many tools to automate the viewing and analysis of the planar images of the IC. Automatic pattern recognition techniques, applied to the metal and polysilicon routing lines in the circuit, can be very effective.

SUMMARY OF THE INVENTION

The present invention prevents the above cited automatic, high level taxonomic approaches from working because the apparent routing of the signal to a transistor is broken in a way that is very difficult to detect. The protection is applied via the programming of the masks, under instruction from the circuit designer, and fits unobtrusively and cost-effectively within the standard, commercial IC process.

According to a first aspect of the present invention, an integrated circuit structure for MOS-type devices is provided, comprising: a silicon substrate of a first conductivity type; first gate insulating regions selectively placed over the silicon substrate of the first conductivity type; a first polycrystalline silicon layer selectively placed over the silicon substrate of the first conductivity type; second gate insulating regions selectively placed over the first gate insulating regions and the first polycrystalline silicon layer; a second polycrystalline silicon layer selectively placed over the second gate insulating regions; first buried silicon regions of a second conductivity type, buried within the silicon substrate of the first conductivity type, placed under the first polycrystalline silicon layer and in contact therewith; and second buried silicon regions of the second conductivity type, buried within the silicon substrate of the first conductivity type, placed under the second gate insulating regions, under the second polycrystalline silicon layer and insulated therefrom.

According to a second aspect of the present invention, a process for forming an integrated circuit structure is provided, comprising the steps of: providing a silicon substrate of a first conductivity type; depositing a first insulating layer over the silicon substrate of the first conductivity type; forming first gate insulating regions in the insulating layer; forming first and second buried silicon regions of a second conductivity type within the silicon substrate of the first conductivity type; depositing a first polycrystalline silicon layer, said first polycrystalline silicon layer contacting said first buried silicon regions; depositing a second insulating layer over the first insulating layer, the first polycrystalline silicon layer and the second buried silicon regions; and depositing a second polycrystalline silicon layer over said second insulating layer and said second buried silicon regions of the second conductivity type, said second buried silicon regions of the second conductivity type being insulated from said second polycrystalline silicon layer.

According to a third aspect of the present invention, in an integrated circuit structure for MOS-type devices comprising a silicon substrate of a first conductivity type, a first-level polysilicon layer, a second-level polysilicon layer and buried silicon regions of a second conductivity type buried within the silicon substrate of the first conductivity type, an arrangement is provided for programmably connecting the buried silicon regions of the second conductivity type to the polysilicon layers or alternatively programmably isolating the buried silicon regions of the second conductivity type from the polysilicon layers.

According to a fourth aspect of the present invention, a process for forming a programmable multi-level polysilicon device in an integrated MOS-type circuit structure is provided, comprising the steps of: providing a silicon substrate of a first conductivity type; forming buried silicon regions of a second conductivity type within the silicon substrate of the first conductivity type; depositing a first polycrystalline silicon layer over the silicon substrate of the first conductivity type; and depositing a second polycrystalline silicon layer over the silicon substrate of the first conductivity type, wherein a first portion of said buried silicon regions of the second conductivity type contacts the first polycrystalline silicon layer and is isolated from the second polycrystalline silicon layer, and a second portion of said buried silicon regions is insulated from the first and the second polycrystalline silicon layer.

A buried contact is a known structure in integrated circuit fabrication technology, firstly developed in the late 1970's with nMOS circuits. A buried contact provides a direct connection between polysilicon, normally the gate of a MOS transistor, and the source/drain region of a MOS transistor. To create buried contacts, contact openings are masked and etched after gate oxide growth and before deposition and patterning of polysilicon. In this way the polysilicon over the source and/or drain regions can make direct contact to the source and/or drain regions by means of the buried contact openings.

The present invention discloses an integrated circuit structure and a process for preventing reverse engineering of integrated circuits, by use of a buried contact process that provides the opportunity for a programmable connector/isolator. In particular, the buried contact process employs at least two polysilicon layers. Such is the case in virtually all CMOS processes that manufacture DRAMs and EEPROMs. The process according to the present invention will make it possible to selectively interrupt the apparent conduction connections at various transistors sources and drains throughout the circuit.

Polysilicon has long been used to form the gates for MOS transistors, see for example VLSI technology, S. M. Sze, McGraw-Hill, 1983 p. 99. This requires a CMOS process having one level of deposited polysilicon. CMOS processes employing two polysilicon layers, the two layers typically being separated by an oxide layer, make possible the formation of capacitors and electrically eraseable read only memories (EEPROMs), see Hodges and Jackson, Analysis and Design of Digital Integrated Circuits, 2d. ed., McGraw-Hill, 1988, p. 353. See also S. M. Sze, supra, pp. 461–465, for a reference to buried contact devices. The concept of the buried contact using two levels of polysilicon is preferably being considered for processes having minimum feature sizes approaching or below 0.2 µm.

According to the present invention, the buried contact can be placed in correspondence of a first or a second level of polysilicon placed thereover, and in this way be programmed to be a connection or isolation. In particular, when the buried contact is placed under the first level of polysilicon, it acts as a connection. On the contrary, when the buried contact is placed under the second level of polysilicon, it acts as an isolation. In this last case, a thin gate oxide under the second level polysilicon is provided, in order to insulate the second level polysilicon from the buried contact. Therefore, the circuit designer can "program" the use of the buried contact according to different schemes, by provision of a dual deposition of the thin gate oxide, as later explained in detail.

In an integrated circuit realized according to the present invention, a reverse engineer will find it very difficult to determine the presence of a thin gate oxide between the polysilicon and the source and/or drain region of a nMOS device, a pMOS device or a CMOS device.

BRIEF DESCRIPTION OF THE DRAWINGS

The present invention will be understood and appreciated more fully from the following detailed description taken in conjunction with the drawings in which.

DETAILED DESCRIPTION OF THE INVENTION

Reference will be now made to the drawings where the showings are for the purpose of describing the preferred embodiment of the invention and not for limiting same.

FIGS. 1 to 7 show the process steps preferably utilized to realize the circuit structure comprising the camouflaged connector/isolator according to the present invention.

A standard CMOS process proceeds as follows (see also S. M. Sze, supra, p. 447):

1) P-and N-well formation via ion implantation in the substrate;
2) Deposition of the first insulating layer of silicon dioxide and silicon nitride;
3) Patterning for field oxide growth to define active areas; and
4) Growth of the first gate oxide, a thermal oxide of about 100 Å (larger for processes having larger feature sizes).

Figure 1:
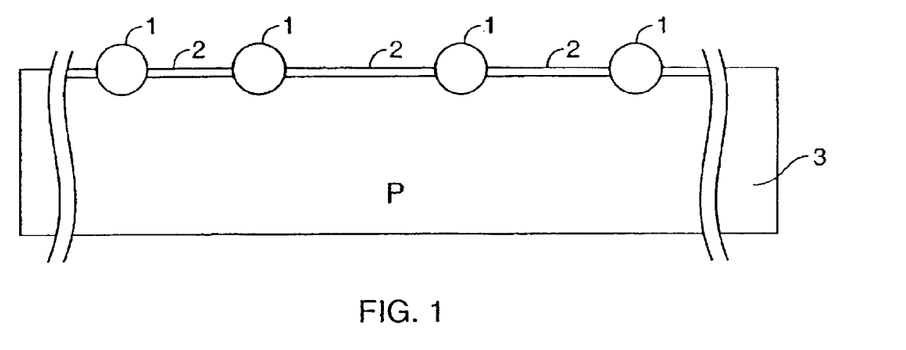
FIG. 1 is a cross section of a first step for realizing the circuit structure according to the present invention.

In this way a structure like the one shown in FIG. 1 is obtained.

FIG. 1 shows the cross section of the P well portion of a CMOS integrated circuit, processed similarly to the foregoing processes through gate oxide. In FIG. 1, the field insulating regions, for example field oxide regions, are indicated by numeral 1, while the first gate insulating regions, for example first gate oxide regions, are indicated by numeral 2. Numeral 3 indicates a silicon well region of a first conductivity type, in this embodiment a P well silicon region. The field oxide shown here can be for example the conventional LOCOS (LOCal Oxidation of Silicon) oxide. Newer technology like the shallow trench field oxide can also be used. However, these techniques will be not described here in detail, both because they are well-known and because they are not important to an understanding of the present invention.

Figure 2:
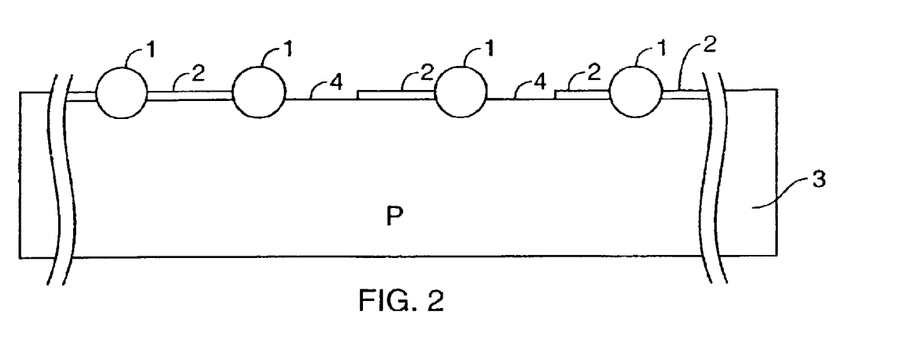
FIG. 2 is a cross section of a second step for realizing the circuit structure according to the present invention.

FIG. 2 shows a subsequent step of the process according to the invention. In this step surfaces 4 for the subsequent implantation of buried contact regions are opened by masking and etching.

Figure 3:
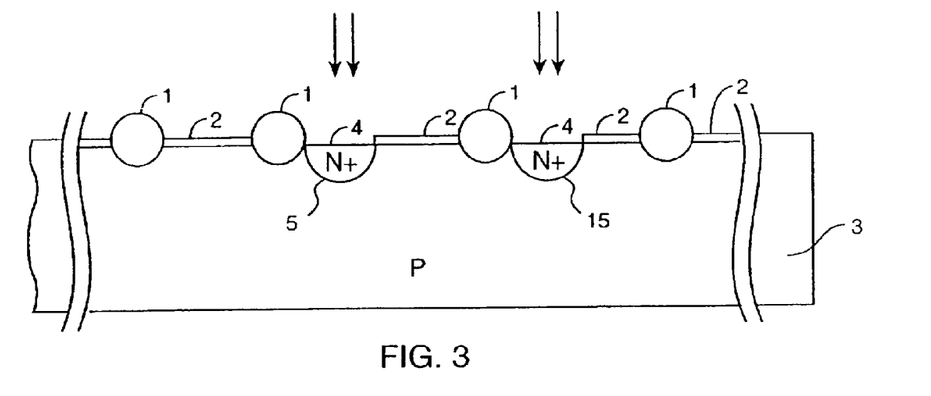
FIG. 3 is a cross section of a third step for realizing the circuit structure according to the present invention.

FIG. 3 shows a subsequent step, in which buried regions 5, 15 of a second conductivity type, in this embodiment highly doped N+ regions, are implanted in the P well 3.

Figure 4:
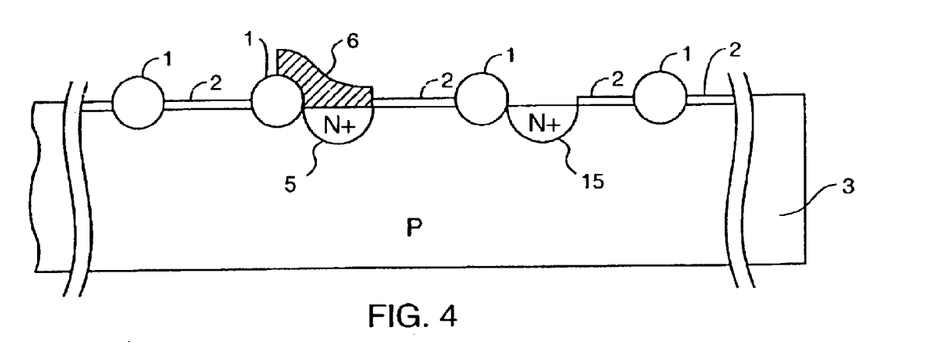
FIG. 4 is a cross section of a fourth step for realizing the circuit structure according to the present invention.

FIG. 4 shows the result after a subsequent step of deposition and patterning of a first polysilicon layer 6. The first polysilicon layer 6 contacts some of the N+ regions implanted in the previous step. As shown in FIG. 4, the first polysilicon layer 6 contacts the N+ region 5, creating a conductive path between the polysilicon layer 6 and the buried N+ region 5.

Figure 5:
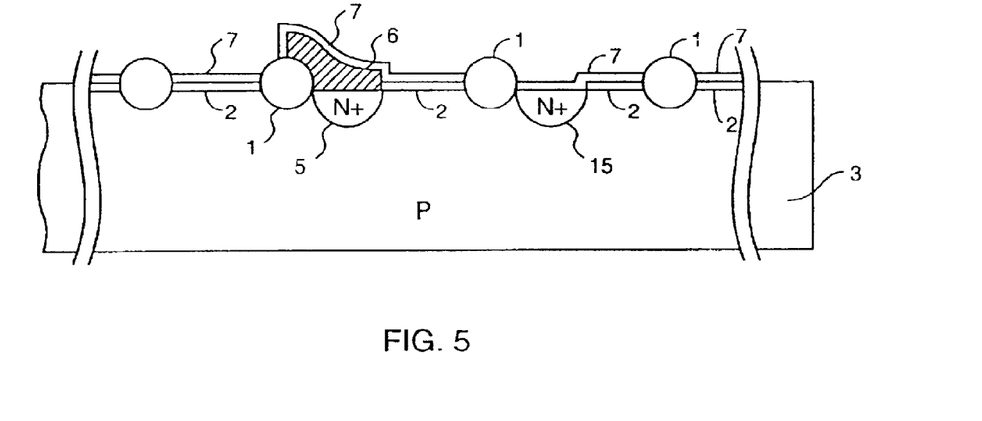
FIG. 5 is a cross section of a fifth step for realizing the circuit structure according to the present invention.

FIG. 5 shows a subsequent step, in which a second gate oxide layer 7, usually at 100 Å to 200 Å, is grown or deposited on top, i.e. covering in part the first polysilicon layer 6, in part the first gate insulator 2, and in part buried N+ regions like the buried N+ region 15.

Figure 6:
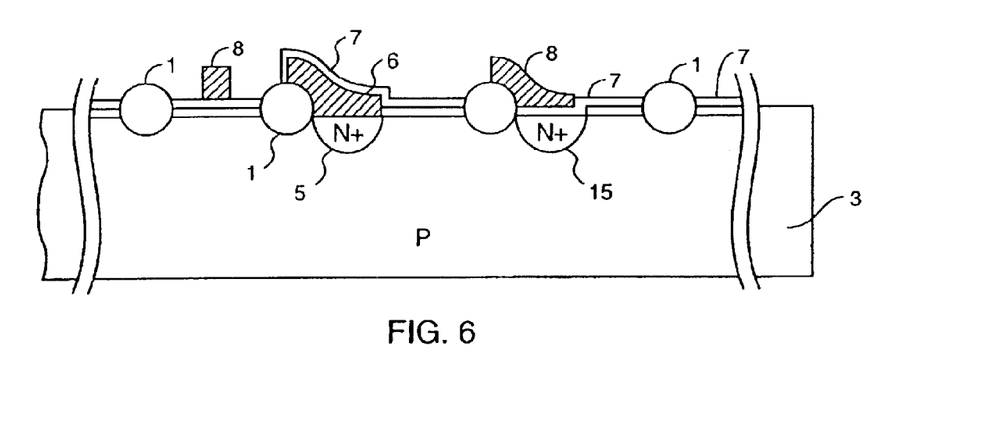
FIG. 6 is a cross section of a sixth step for realizing the circuit structure according to the present invention.

FIG. 6 shows a subsequent step, in which a second polysilicon layer 8 is deposited and patterned by etching. The second polysilicon layer 8 is also placed over some of the N+ regions previously implanted, without contacting them. As shown in FIG. 6, the second polysilicon layer 8 is for example placed over the N+ region 15, isolated therefrom by means of the second gate oxide 7.

Figure 7:
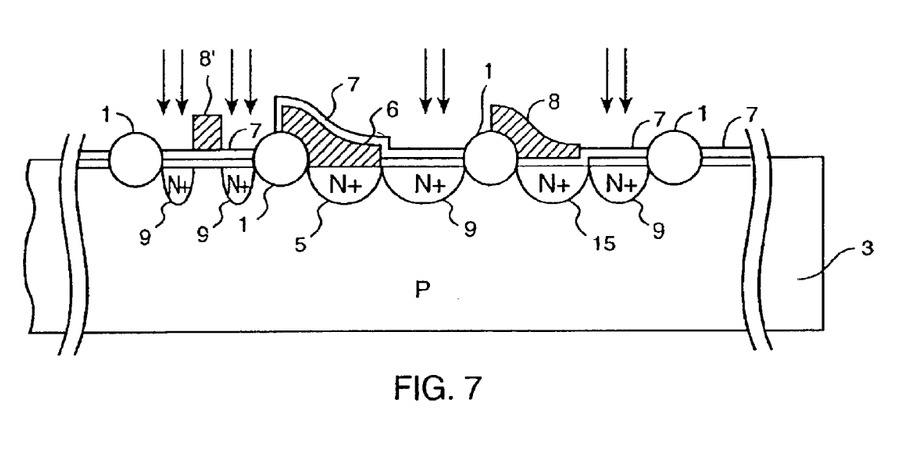
FIG. 7 is a cross section of a seventh step for realizing the circuit structure according to the present invention.

FIG. 7 shows a cross section after a subsequent source/drain implant, where source/drain N+ regions 9 have been created, preferably by implantation. In FIG. 7, it should be noted that the first polysilicon layer 6 makes contact to the N+ source/drain implant 5 while the second polysilicon layer 8 is isolated from the N+ source/drain implant 15 by means of the second gate oxide 7. Optically, these two structures are virtually undistinguishable from a top plan view. Even in the cross section, it is very hard to detect the presence of the 100 Å thick gate oxide 7.

As a consequence, for each P well region, "buried contact" areas of two types can be created. A first type of N+ regions 5, connected to the first polysilicon layer 6 and insulated from the second polysilicon layer 8, serve as a "buried contact" connection, and therefore act as an usual buried contact. This contact could be for example a gate to power supply or an input-gate contact. A second type of N+ regions 15, insulated from the first polysilicon layer 6 and from the second polysilicon layer 8, serve as a "buried contact" insulation, and therefore act a faked buried contact. As a consequence, what appears to be a normal buried contact (namely polysilicon over an N+ implanted area) is in fact blocked. The block occurs because the second polysilicon layer 8 and the second gate oxide 7 are used.

The structure according to the present invention represents a very good candidate for protecting integrated circuit design from reverse engineering. It will be difficult, if not impossible, for the reverse engineer, viewing structures realized according to the present invention, to see that the buried contact insulation is not a normal buried contact. Moreover, it would be inordinately time consuming and expensive for the reverse engineer to make enough cross sections at possible connecting points within the circuit to determine all the times such buried contact insulation is present. The polysilicon layer 8' on the left of FIG. 7 shows a typical N-channel transistor formed in the process with both the first and second level of gate oxide. This transistor has been put in the drawing of FIG. 7 as a reference.

Figure 8:
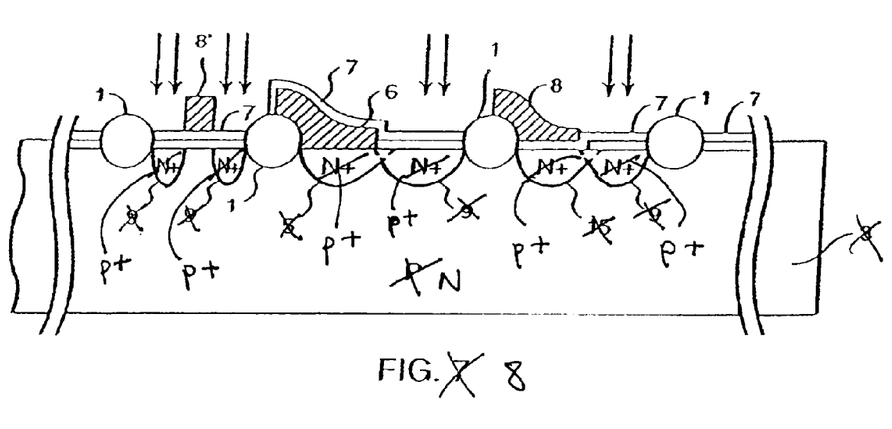
FIG. 8 shows an embodiment where the integrated circuit structure comprises an N type substrate and P+ type buried silicon regions.

FIG. 8 shows an embodiment where the integrated circuit structure comprises an N type substrate and P+ type buried silicon regions.

The invention has been described with reference to a particular embodiment. Modifications and alterations will occur to others upon reading and understanding this specification. It is intended that all such modifications and alterations are included insofar as they come within the scope of the appended claims or equivalents thereof.

What is claimed is:

1. A process for forming an integrated circuit structure, comprising the steps of:
    providing a silicon substrate of a first conductivity type;
    depositing a first insulating layer over the silicon substrate of the first conductivity type;
    forming first gate insulating regions in the insulating layer;
    forming first and second buried silicon regions of a second conductivity type within the silicon substrate of the first conductivity type;
    depositing a first polycrystalline silicon layer, said first polycrystalline silicon layer contacting said first buried silicon regions;
    depositing a second insulating layer over the first insulating layer, the first polycrystalline silicon layer and the second buried silicon regions; and
    depositing a second polycrystalline silicon layer over said second insulating layer and said second buried silicon regions of the second conductivity type, said second buried silicon regions of the second conductivity type being insulated from said second polycrystalline silicon layer.

2. The process of claim 1, further providing the step of forming third buried silicon regions of the second conductivity type within the silicon substrate of the first conductivity type.

3. The process of claim 1, further providing the steps of:
    providing a silicon substrate of the second conductivity type, buried within the silicon substrate of the first conductivity type;
    forming first and second buried silicon regions of the first conductivity type, buried within the silicon substrate of the second conductivity type, wherein
    said first gate insulating regions are selectively placed over the silicon substrate of the second conductivity type;
    said first polycrystalline silicon layer is selectively placed over the silicon substrate of the second conductivity type;
    said first buried silicon regions of the first conductivity type are placed under the first polycrystalline silicon layer and
    said second buried silicon regions of the first conductivity type are placed under the second gate insulating regions and the second polycrystalline silicon layer.

4. The process of claim 3, further providing the step of forming third buried silicon regions of the first conductivity type, buried within the silicon substrate of the second conductivity type, placed under the first gate insulating regions and the second gate insulating regions, and being insulated from the first polycrystalline silicon layer and the second polycrystalline silicon layer.

5. A process for forming a programmable multi-level polysilicon device in an integrated MOS-type circuit structure, comprising the steps of:
    providing a silicon substrate of a first conductivity type;
    forming buried silicon regions of a second conductivity type within the silicon substrate of the first conductivity type;
    depositing a first polycrystalline silicon layer over the silicon substrate of the first conductivity type; and depositing a second polycrystalline silicon layer over the silicon substrate of the first conductivity type, wherein a first portion of said buried silicon regions of the second conductivity type contacts the first polycrystalline silicon layer and is isolated from the second polycrystalline silicon layer, and a second portion of said buried silicon regions is insulated from the first and the second polycrystalline silicon layer.

6. The process of claim 5, further comprising the steps of:

providing a silicon substrate of a second conductivity type, buried within the silicon substrate of the first conductivity type;

forming buried silicon regions of the first conductivity type within the silicon substrate of the second conductivity type;

depositing the first polycrystalline silicon layer over the silicon substrate of the second conductivity type; and depositing the second polycrystalline silicon layer over the silicon substrate of the second conductivity type, wherein a first portion of said buried silicon regions of the first conductivity type contacts the first polycrystalline silicon layer, and a second portion of said buried silicon regions of the second conductivity type is insulated from the first and second polycrystalline silicon layer.

* * * * *